United States Patent
Hashimoto et al.

(10) Patent No.: US 6,791,835 B2
(45) Date of Patent: Sep. 14, 2004

(54) ELECTRONIC DEVICE

(75) Inventors: Eiji Hashimoto, Nishitokyo (JP);
Yoshinori Kamikawa, Akishima (JP);
Tornomi Murayama, Nishitama-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/389,977

(22) Filed: Mar. 18, 2003

(65) Prior Publication Data

US 2003/0198017 A1 Oct. 23, 2003

(30) Foreign Application Priority Data

Apr. 22, 2002 (JP) ........................................ 2002-119545

(51) Int. Cl.$^7$ ................................................. G06F 1/20
(52) U.S. Cl. ....................... 361/687; 361/792; 257/737; 174/52.5
(58) Field of Search ............................... 361/679–687, 361/724–727, 749–750, 760, 792; 257/735–737; 174/52.2

(56) References Cited

U.S. PATENT DOCUMENTS 6,376,769 B1 * 4/2002 Chung ....................... 174/52.2
6,487,073 B2 * 11/2002 McCullough et al. ........ 361/687
6,487,074 B1 * 11/2002 Kimura et al. .............. 361/695
6,590,285 B1 * 7/2003 Davis et al. ................. 257/735

FOREIGN PATENT DOCUMENTS

| TW | 419115 | 1/2001 |
| TW | 447737 | 7/2001 |

* cited by examiner

*Primary Examiner*—Hung Van Duong
(74) *Attorney, Agent, or Firm*—Pillsbury Winthrop LLP

(57) ABSTRACT

A rectangular heating section is so shaped as to touch the electronic component except corners of the rectangle when the surface of the electronic component does not parallel the heating section. For example, the heating section is formed to be smaller than the electronic component surface, to be a rectangle which is smaller than the electronic component surface and comprises rounded corners, to be an octagon which is smaller than the electronic component surface and is formed by cutting off corners of the rectangle, or to be an octagon which is larger than the electronic component surface and is formed by cutting off corners of the rectangle. A die is prevented from being damaged due to a contact with the heating section of a cooling module at a given point of the die according to a mounting error or a usage state.

15 Claims, 4 Drawing Sheets

ELECTRONIC DEVICE

CROSS-REFERENCE TO RELATED APPLICATIONS

This application is based upon and claims the benefit of priority from the prior Japanese Patent Application No. 2002-119545, filed Apr. 22, 2002, the entire contents of which are incorporated herein by reference.

BACKGROUND OF THE INVENTION

1. Field of the Invention

The present invention relates to an electronic device, and more particularly to a cooling mechanism that dissipates heat generated from electronic components and cools the electronic device.

2. Description of the Related Art

In recent years, CPUs mounted on electronic devices are getting more improved operating clock frequencies, more increased speeds and performance, and accordingly more increased heat radiation. It is necessary to cool the CPU for maintaining its performance. As a cooling method, a cooling member such as a heat sink is attached to the CPU's top surface to dissipate heat from the CPU.

Conventionally, an electronic device such as a computer includes a circuit board in its case. The CPU is mounted on this board. There is also available a BGA-type (BGA: ball grid array) CPU whose bottom surface has a plurality of solder balls arranged in matrix form. The CPU's solder balls are soldered to the circuit board, for example. The heat sink is mounted above the CPU, e.g., via a highly thermal conductive heat transfer sheet for radiating heat from the CPU. The heat sink is made of a highly thermal conductive material such as aluminum that integrally forms a supporting section for fixing the heat sink to the circuit board. The supporting section of the heat sink is screwed to the circuit board so that the CPU is mounted between the circuit board and the heat sink.

In the conventional cooling module, the heat sink is screwed to the case, the circuit board, or the like. The cooling module is structured so that a force applied to screws is directly applied to the CPU. The CPU is heavily weighted in order to ensure a secure connection between the CPU and the heat sink despite various dimensional errors including a CPU's dimensional error, mounting height variations due to dimensional errors of CPU electrodes such as solder bumps, solder balls, etc., a heat sink's manufacturing tolerance, and the like.

Recently, it begins to employ a floating structure that mounts the cooling module such as the heat sink on the circuit board via an elastic member. According to this method, the cooling module is appropriately connected to the top surface of the CPU in accordance with mounting height variations of the CPU. Lately, there is available a type of CPU whose element (die) is exposed to the top surface of the package. Such CPU can connect with the floating-structure cooling module. If the CPU has mounting height variations, the elastic member absorbs a height dimension to maintain thermal connection between the element and the cooling module.

Since a notebook personal computer is used in many ways, however, it is subject to vibration and shock during transportation and may be subject to an unexpected external force. If an external force is too large for the floating structure to absorb, it is impossible to ensure thermal surface connection between the die and the heating section. In such a case, the heating section touches part of the die surface to cause a stress to be concentrated, breaking the die surface. The die is easily damaged when the heating section touches corners or sides on the die surface.

As mentioned above, the conventional cooling module has a drawback that a mounting error or usage state may eliminate the surface contact between the heating section and the electronic component and that a stress concentrates on part of the electronic component to damage it.

BRIEF SUMMARY OF THE INVENTION

According to an embodiment of the present invention, an electronic device comprises a case, a circuit board contained in the case, an electronic component which is mounted on the circuit board and comprises a base and a rectangular parallelepiped element mounted on the base, and a cooling module which is thermally connected to the rectangular parallelepiped element and has a heating portion receiving heat from the electronic component, the heating portion being thermally connected to portions other than corners of the rectangular parallelepiped element.

BRIEF DESCRIPTION OF THE SEVERAL VIEWS OF THE DRAWINGS

The accompanying drawings, which are incorporated in and constitute a part of the specification, illustrate embodiments of the present invention and, together with the general description given above and the detailed description of the embodiments given below, serve to explain the principles of the present invention in which.

DETAILED DESCRIPTION OF THE INVENTION

An embodiment of an electronic device according to the present invention will now be described with reference to the accompanying drawings.

Figure 1:
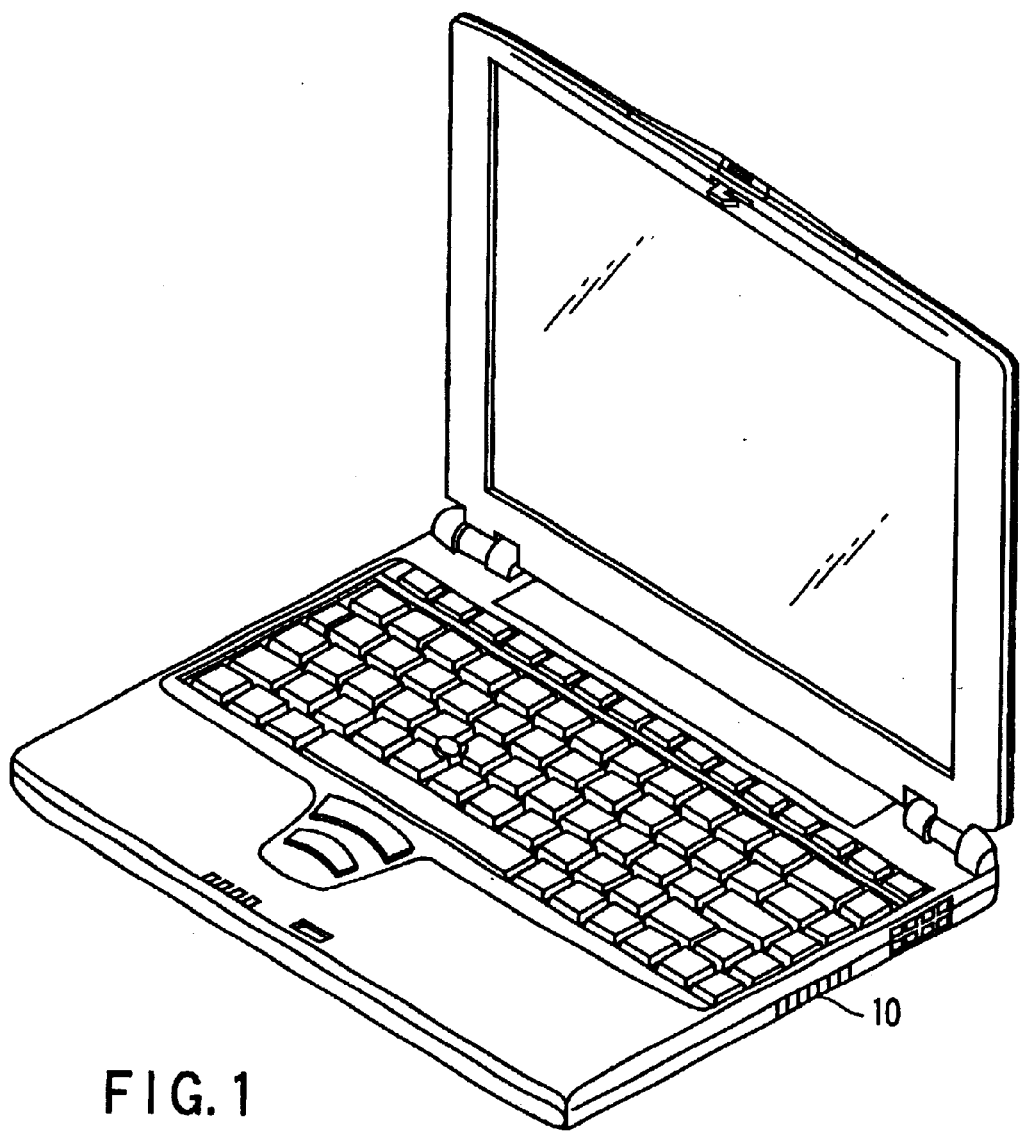
FIG. 1 is a perspective view showing a notebook personal computer as an embodiment of an electronic device according to the present invention.

FIG. 1 is a perspective view of a notebook personal computer as an example of the electronic device according to an embodiment of the present invention. On the right side thereof, there is provided a heat exhaust opening 10 to exhaust heat from a CPU to be described later. According to the example in FIG. 1, there are arranged electronic parts such as the CPU at the right end of a printed circuit board in the body. This is because the heat exhaust opening 10 is provided on the right side. If the CPU is installed at a different position, the heat exhaust opening 10 is also provided on the different side near the CPU.

Figure 2:
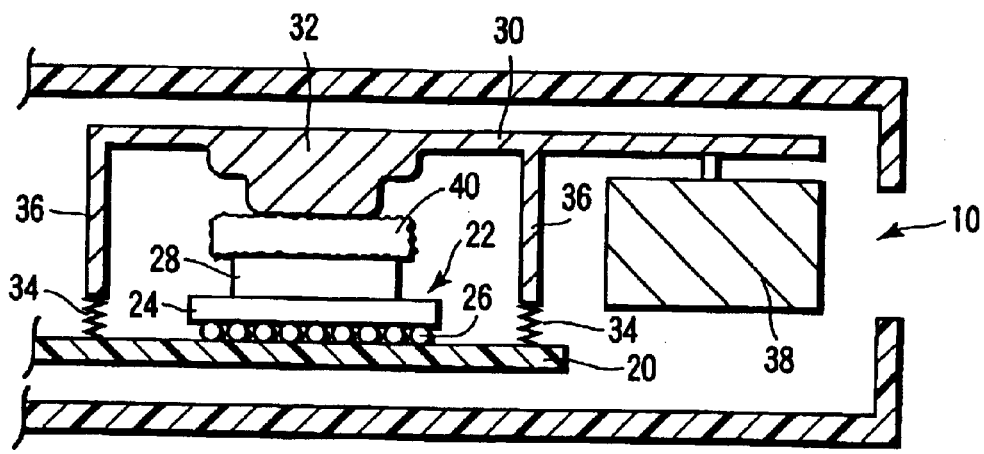
FIG. 2 is a sectional view showing an internal structure of the notebook personal computer in FIG. 1.

FIG. 2 shows a sectional view of the notebook personal computer. A CPU 22 of the BGA package is mounted on the surface of a printed circuit board 20. In the BGA package, solder balls 26 are arranged in matrix form on the bottom surface of a base 24. When mounted on the surface of the printed circuit board 20, the solder balls 26 are melted and work as adhesive. The solder balls 26 are also called as thermal balls and dissipate heat from a die 28 provided on the base 24. FIG. 2 shows a state before the solder balls 26 are melted (before the CPU 22 is mounted).

A cooling module is provided on the CPU 22. The cooling module comprises a metal plate 30; a heating section 32 protruding at a position corresponding to the surface of the CPU 22 (die 28) on the metal plate 30; and a fan 38 provided at the end of the metal plate 30 near the heat exhaust opening 10. The metal plate 30, working as a heating plate, is provided with four legs 36 for fixing the cooling module to the printed circuit board 20 around the CPU 22. The legs 36 are fixed to the printed circuit board 20 via springs 34. The cooling module has a floating structure. The die 28 does not directly contact with the heating section 32. In order to improve the thermal conductivity, they are thermally connected via a thermal conductive member 40 such as grease, a thermal conductive sheet, and the like. A fan 38 is provided with blades on its curved surface and has a rotating shaft perpendicular to the metal plate 30. Accordingly, the heat is dissipated transversely from the CPU 22 at the left to the heat exhaust opening 10 at the right.

Figure 3:
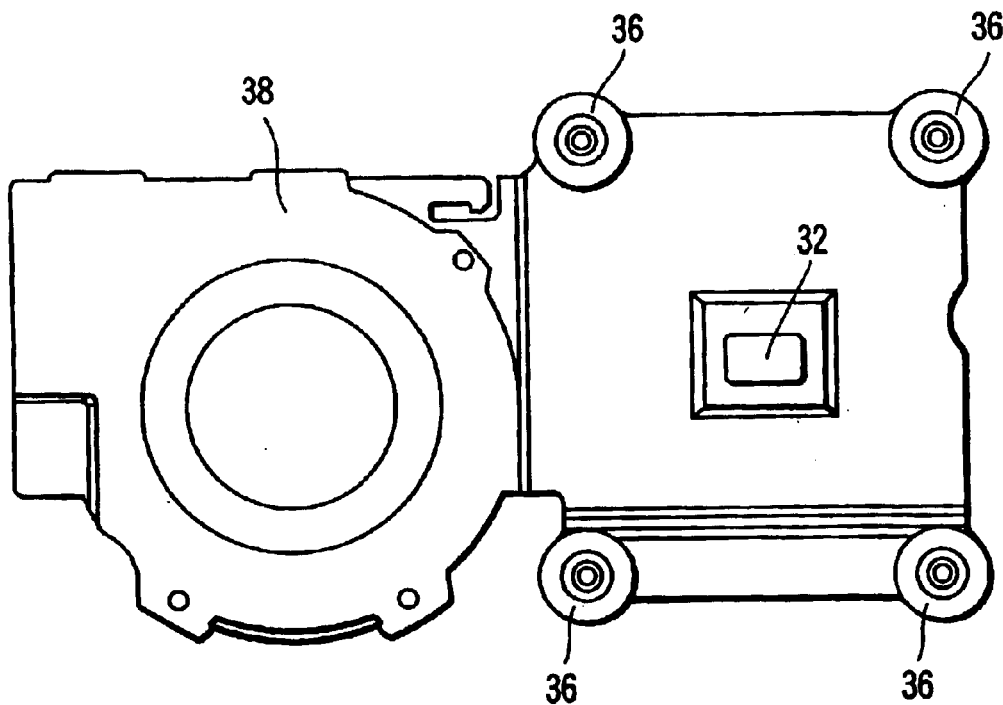
FIG. 3 is a plan view of the cooling module in FIG. 2.

FIG. 3 is a plan view of the cooling module.

As shown in FIG. 2, if the CPU 22 and the cooling module are correctly mounted on the printed circuit board 20 and the heating section 32 of the cooling module is formed precisely, surfaces of the heating section 32 and the die 28 are arranged in parallel with each other, causing no point contact therebetween. No force is applied to part of the die 28 to damage it. If an external force is applied from the outside so largely as to exceed a shock absorbing force of the spring 34, it becomes impossible to maintain the parallelism between the surfaces of the heating section 32 and the die 28. According to the prior art, the heating section 32 protruding from the metal plate 30 touches corners and sides of the die 28, damaging contacted portions. According to the embodiment, however, the heating section 32 of the cooling module is so formed as to touch the die 28 except its corners on the rectangular surface when the surface of the die 28 is not in parallel with the heating section 32. The heating section 32 does not touch a corner on the surface of the die 28. Since that corner is most susceptible to a stress, the die 28 can be protected against damage.

Figure 4A:
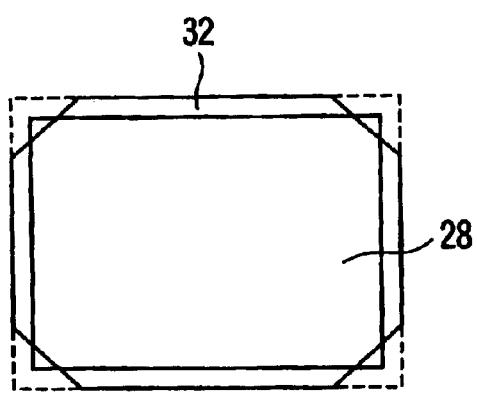
FIGS. 4A and 4B are plan views illustrating shapes of a heating section in the cooling module.
Figure 4B:
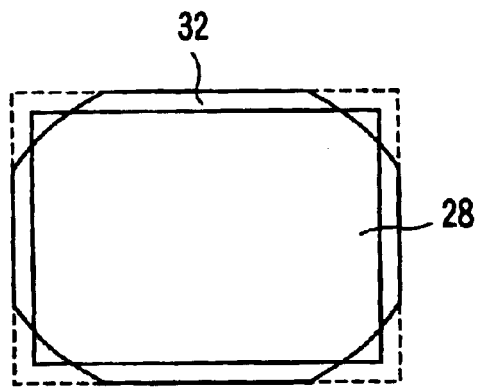

The plan views in FIGS. 4A and 4B exemplify shapes of the heating section 32. The die 28 may be as large as the heating section 32. For convenience of the illustration, the heating section 32 is shown to be larger than the die 28. As shown in FIG. 4A, it is assumed that the heating section 32 is larger than the die 28 and is formed to be an octagon by cutting its four corners of the rectangle. Alternatively, as shown in FIG. 4B, the heating section 32 is assumed to be larger than the die 28 and is rounded at its four corners of the rectangle. If the parallelism is not maintained between the heating section 32 and the die 28, the heating section 32 does not touch four corners on the surface of the rectangular die 28, preventing it from being damaged.

Figure 5A:
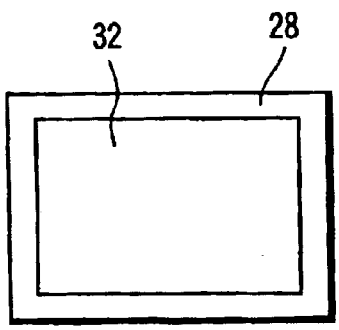
FIGS. 5A, 5B and 5C are plan views illustrating shapes of the heating section in the cooling module.
Figure 5B:
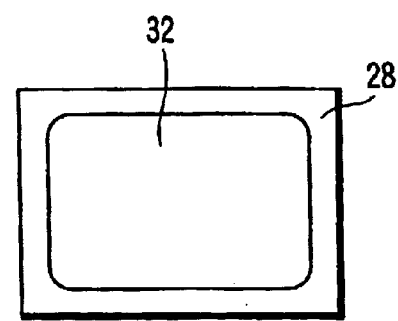
Figure 5C:
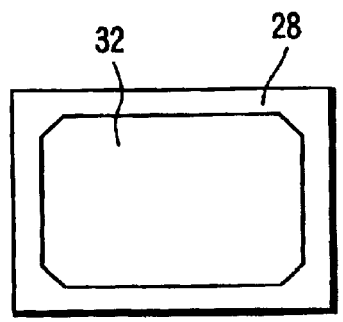
Figure 6A:
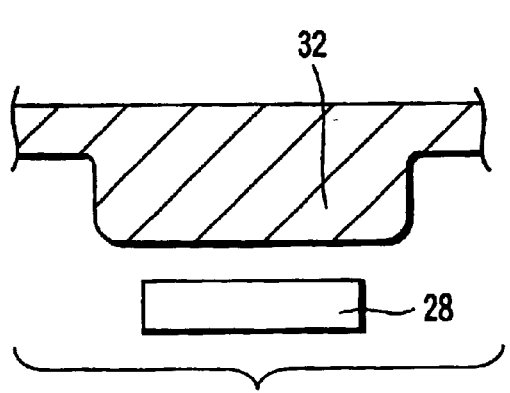
FIGS. 6A to 6D are plan views illustrating shapes of the heating section in the cooling module.
Figure 6B:
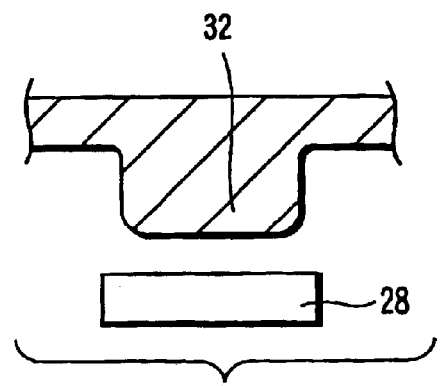
Figure 6C:
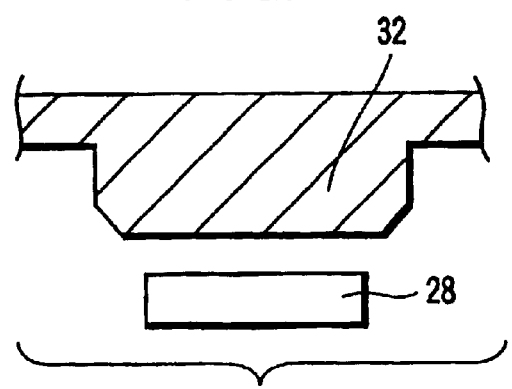
Figure 6D:
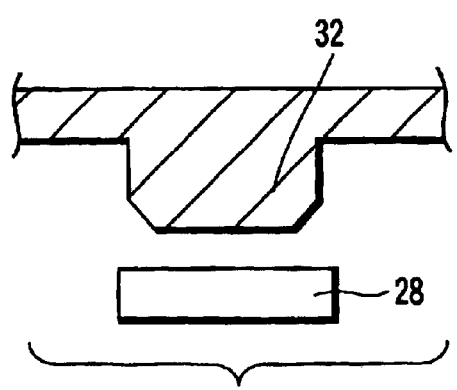

The plan views in FIGS. 5A, 5B, and 5C show other shape examples of the heating section 32. According to the examples in FIGS. 4A and 4B, the heating section 32 is larger than or equal to the die 28. According to the examples in FIGS. 5A, 5B, and 5C, the heating section 32 is smaller than the die 28. As shown in FIG. 5A, the heating section 32 is a rectangle similar to the die 28 and is smaller than it. Alternatively, as shown in FIG. 5B, the heating section 32 is smaller than the die 28 and may be rounded at its four corners of the rectangle. As shown in FIG. 5C, the heating section 32 is smaller than the die 28 and may be octagonal by cutting four corners of the rectangle. If the parallelism is not maintained between the heating section 32 and the die 28, the heating section 32 does not touch four corners and sides on the surface of the rectangular die 28. Since the sides are also fragile next to the corners, the shapes in FIGS. 5A, 5B, and 5C further decrease possibilities of damaging the die 28. As shown in FIGS. 5B and 5C, the heating section 32 has no corners. If the heating section 32 touches the surface of the die 28, the stress does not concentrate on the surface, further decreasing possibilities of damaging the die 28.

While the above-mentioned shapes are viewed from the plan view, FIGS. 6A through 6D show sectional views of the heating section 32 with its corners rounded or cut, much more decreasing possibilities of damaging the die 28. The heating section 32 may be larger or smaller than the die 28.

According to the embodiment as mentioned above, the electronic device comprises the electronic component (CPU) having a rectangular surface and the cooling module having the heating section which is thermally connected to the surface of the electronic component and receives heat therefrom. The heating section is so shaped that the heating section touches the surface of the electronic component except the heating section corners when the heating section does not parallel to the electronic component. This prevents the heating section from touching and damaging corners of the electronic component.

The heating section may be shaped to touch anywhere except sides on the rectangular surface of the electronic component when the electronic component surface does not parallel the heating section. This also prevents the heating section from touching and damaging sides of the electronic component.

The heating section may be shaped as follows.

1. The heating section is smaller than the electronic component surface;
2. The heating section surface is shaped to be a rectangle which is smaller than the electronic component surface and has rounded corners;
3. The heating section surface is shaped to be an octagon which is smaller than the electronic component surface and is formed by cutting off corners of the rectangle;
4. The heating section surface is shaped to be an octagon which is larger than the electronic component surface and is formed by cutting off corners of the rectangle; or
5. The heating section comprises a protrusion that protrudes from the cooling module toward the electronic component. The protrusion has a surface smaller than the electronic component surface and has rounded corners.

As mentioned above, the embodiment of the present invention can provide an electronic device that prevents the heating section from touching a given point of the electronic component, prevents a stress from concentrating on a given point of the electronic component, and consequently prevents the electronic component from being damaged.

Figure 7:
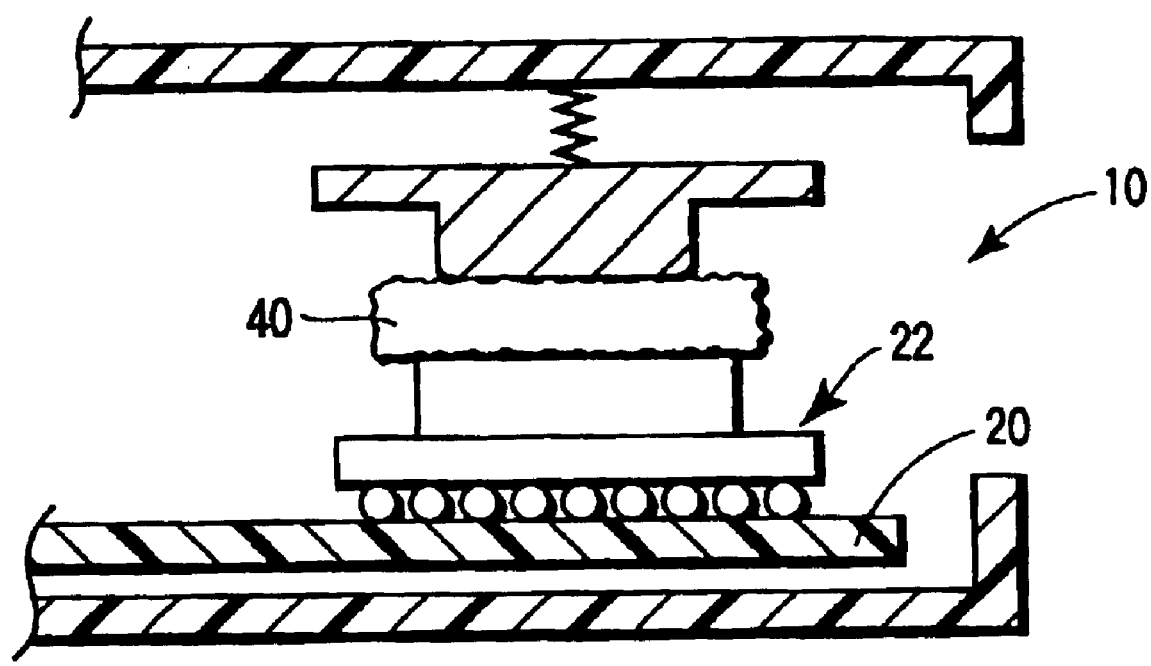
FIG. 7 is a sectional view showing an internal structure of the notebook personal computer according to another embodiment.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein. For example, the electronic component is a BGA package but is not limited thereto. The present invention is also applicable to a TCP (tape carrier package). The present invention is not limited to the design that fixes the cooling module to the printed circuit board. As shown in FIG. 7, the cooling module may be fixed inside a case via an elastic member such as a spring. In this case, when the case is made of metal material and the like, the case can be used as a second heat sink. According to the embodiments of the present invention, the heating section does not touch corners or sides of the die surface. Accordingly, the cooling module need not necessarily has the floating structure and may be stationary. The cooling module is not limited to the above-mentioned structure. For example, the fan 38 may be omitted. Further, a cooling fin may be provided on the rear side (a surface opposite to the die) of the heating section.

What is claimed is:

1. An electronic device comprising:
   an electronic component having a rectangular surface; and
   a cooling module which is elastically connected to the electronic component and has a heating portion receiving heat from the electronic component;
   wherein the heating portion is elastically connected to portions other than corners of the surface of the electronic component.

2. The electronic device according to claim 1, wherein the heating portion is elastically connected to portions other than sides of the surface of the electronic component.

3. The electronic device according to claim 1, wherein the electronic component comprises a base mounted on a circuit board and a rectangular parallelepiped element mounted on the base and elastically connected to the cooling module.

4. The electronic device according to claim 1, wherein the heating portion comprises a heating area smaller than the surface of the electronic component.

5. The electronic device according to claim 1, wherein the heating portion has a generally rectangular surface with rounded corners, the surface being smaller than the surface of the electronic component, the rounded corners corresponding to corners of the surface of the electronic component.

6. The electronic device according to claim 1, wherein the heating portion has an octagonal surface, the octagonal surface being smaller than the surface of the electronic component.

7. The electronic device according to claim 1, wherein the heating portion has an octagonal surface, the octagonal surface being larger than or equal to the surface of the electronic component.

8. The electronic device according to claim 1, wherein the heating portion has a generally octagonal surface larger than or equal to the surface of the electronic component and which comprises rounded corners corresponding to corners of the surface of the electronic component.

9. The electronic device according to claim 1, wherein the heating portion comprises a rounded projection directed toward the electronic component, a surface of the projection directed toward the electronic component being smaller than the surface of the electronic component.

10. The electronic device according to claim 1, wherein the cooling module is connected to a circuit board via an elastic member.

11. The electronic device according to claim 1, wherein the heating portion is connected to a case of the electronic device via an elastic member.

12. The electronic device according to claim 1, wherein the heating portion is thermally connected to a surface of a case of the electronic device via grease.

13. The electronic device according to claim 1, wherein the electronic component comprises a ball-grid-array base mounted on a circuit board and a die mounted on an upper surface of the base and thermally connected to the heating portion.

14. The electronic device according to claim 1, wherein the cooling module comprises a metal plate having a projection for receiving heat and a fan located on the metal plate and having a rotation shaft perpendicular to the metal plate.

15. The electronic device according to claim 1, wherein the cooling module comprises a metal plate having a projection for receiving heat.

* * * * *

UNITED STATES PATENT AND TRADEMARK OFFICE
CERTIFICATE OF CORRECTION

PATENT NO. : 6,791,835 B2
DATED : September 14, 2004
INVENTOR(S) : Eiji Hashimoto, Yoshinori Kamikawa and Tomomi Murayama It is certified that error appears in the above-identified patent and that said Letters Patent is hereby corrected as shown below:

Title page,
Item [75], Inventors, replace "Tornomi" with -- Tomomi --.

Signed and Sealed this

First Day of February, 2005

JON W. DUDAS
*Director of the United States Patent and Trademark Office*